(12) United States Patent
Kornely et al.

(10) Patent No.: US 9,442,379 B2
(45) Date of Patent: Sep. 13, 2016

(54) METHOD FOR PRODUCING A MICROSCREEN

(71) Applicant: SIEMENS AKTIENGESELLSCHAFT, Munich (DE)

(72) Inventors: Susanne Kornely, Munich (DE); Markus Schieber, Munich (DE); Daniel Sickert, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/770,244

(22) PCT Filed: Feb. 17, 2014

(86) PCT No.: PCT/EP2014/052997
§ 371 (c)(1),
(2) Date: Aug. 25, 2015

(87) PCT Pub. No.: WO2014/128073
PCT Pub. Date: Aug. 28, 2014

(65) Prior Publication Data
US 2016/0004162 A1    Jan. 7, 2016

(30) Foreign Application Priority Data
Feb. 25, 2013   (DE) .......... 10 2013 203 056

(51) Int. Cl.
*B01D 67/00* (2006.01)
*G03F 7/40* (2006.01)
(Continued)

(52) U.S. Cl.
CPC ............. *G03F 7/40* (2013.01); *B01D 39/1692* (2013.01); *B01D 67/0034* (2013.01); *B01D 69/02* (2013.01); *G03F 7/20* (2013.01); *G03F 7/32* (2013.01); *B01D 61/14* (2013.01); *B01D 2323/34* (2013.01); *B01D 2325/02* (2013.01)

(58) Field of Classification Search
CPC .......... G03F 7/20; G03F 7/2002; G03F 7/40; B01D 67/0034; B01D 39/1692; B01D 69/02; B01D 61/14; B01D 2323/34; B01D 2323/345; B01D 2325/02
USPC ........................................ 430/320
See application file for complete search history.

(56) References Cited

U.S. PATENT DOCUMENTS 5,753,014 A    5/1998  Van Rijn
5,807,406 A    9/1998  Brauker et al.
(Continued)

FOREIGN PATENT DOCUMENTS

DE    69 43 4999 T2    4/2008
EP    1 764 146 A2     3/2007
(Continued)

OTHER PUBLICATIONS

Hye-Yeon Cha et al., "Fabrication of all-polymer micro-DMFCs using UV-sensitive photoresist," Electrochimica Acta, vol. 50, 2004, pp. 795-799.
(Continued)

*Primary Examiner* — John A McPherson
(74) *Attorney, Agent, or Firm* — Slayden Grubert Beard PLLC

(57) ABSTRACT

A microscreen, substantially formed of a photoresist material, is produced by applying a photoresist layer to a support using a liquid photoresist, partially covering the photoresist layer with a mask that defines the structure of the microscreen, exposing the photoresist to radiation, developing the photoresist, and removing the photoresist from the support.

2 Claims, 3 Drawing Sheets

(51) Int. Cl.
B01D 39/16 (2006.01)
B01D 69/02 (2006.01)
G03F 7/20 (2006.01)
G03F 7/32 (2006.01)
B01D 61/14 (2006.01)

(56) References Cited

U.S. PATENT DOCUMENTS

| | | |
|---|---|---|
| 7,442,303 B2 | 10/2008 | Jacobson |
| 7,784,619 B2 | 8/2010 | Jacobson |
| 2004/0028602 A1 | 2/2004 | Franz et al. |
| 2005/0266335 A1 | 12/2005 | Johnson et al. |
| 2008/0023572 A1* | 1/2008 | Clark ............ G03F 7/0015 239/145 |
| 2011/0042301 A1 | 2/2011 | Zhang et al. |
| 2012/0183946 A1 | 7/2012 | Tang et al. |

FOREIGN PATENT DOCUMENTS

| | | |
|---|---|---|
| KR | 10-1215464 | 12/2012 |
| WO | 2011/139455 A1 | 11/2011 |
| WO | 2013/043124 A1 | 3/2013 |
| WO | 2013/049936 A1 | 4/2013 |

OTHER PUBLICATIONS

Cees J M van Rijn et al., "Nanosieves with microsystem technology for microfiltration applications," Nanotechnology, vol. 9, 1998, pp. 343-345.
German Office Action for German Priority Patent Application No. 10 2013 203 056.8, issued Jan. 29, 2014, 5 pages.
International Search Report for PCT/EP2014/052997, mailed May 9, 2014, 3 pages.
PCT/EP2014/052997, Feb. 17, 2014, Susanne Kornely et al., Siemens AG.
DE 10 2013 203 056.8, Feb. 25, 2013, Susanne Kornely et al., Siemens AG.

* cited by examiner

FIG 1
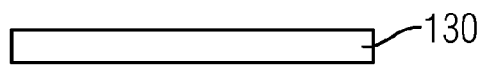
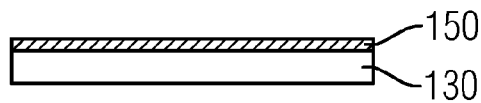
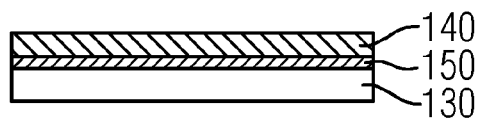
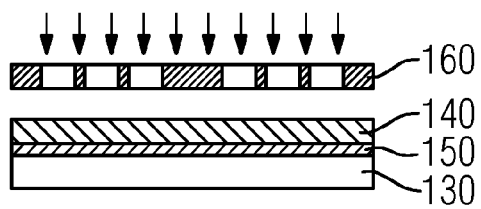
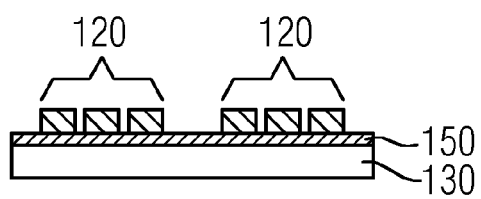
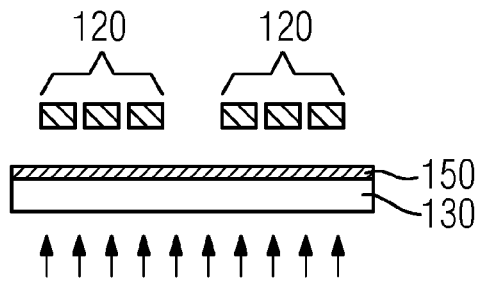

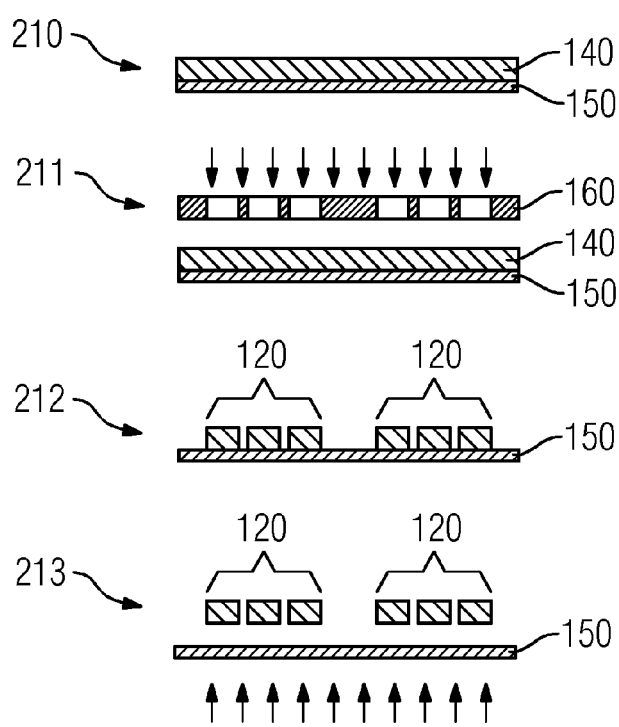
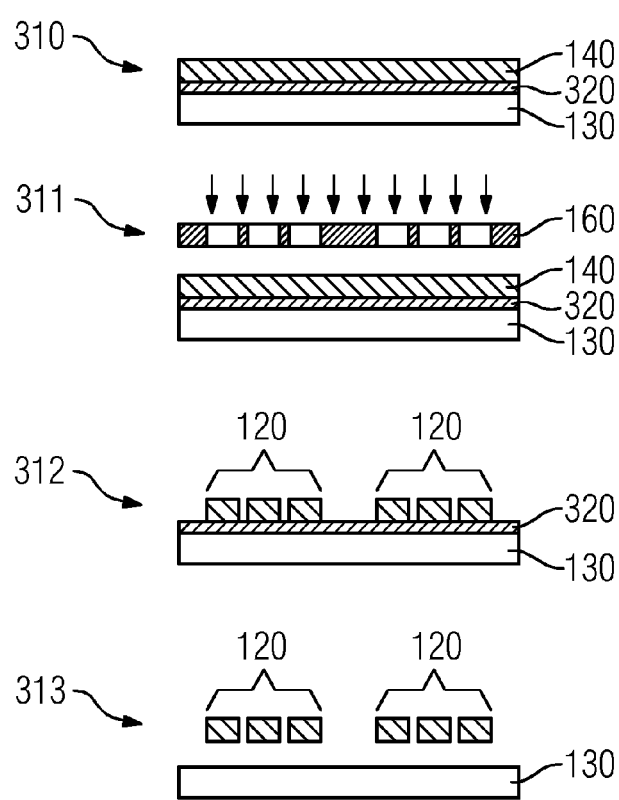

METHOD FOR PRODUCING A MICROSCREEN

CROSS REFERENCE TO RELATED APPLICATIONS

This application is the U.S. national stage of International Application No. PCT/EP2014/052997, filed Feb. 17, 2014 and claims the benefit thereof. The International Application claims the benefits of German Application No. 102013203056.8 filed on Feb. 25, 2013, both applications are incorporated by reference herein in their entirety.

BACKGROUND

Described below is a process for producing a microsieve.

Microsieves are nowadays increasingly being used for demanding separation tasks, for example in medical technology or biotechnology. For instance, the enrichment or extraction of particular cells from human blood can be effected by filtration of the blood through a microsieve (microfiltration). Microsieves, in contrast to the known micro filters made from sponge-like polymeric or ceramic membranes, have a defined pore geometry and are therefore much more efficient and have better classification.

For optimization of a filtration method, a freely selectable pore geometry and pore density and distribution of the microsieve are desirable. In contrast to sponge-like filter membranes, the particles retained barely penetrate into the surface, if at all, in the case of microsieves. Thus, they are firstly more easily identifiable microscopically and secondly can be detached more easily from the filter if required by further analysis methods.

One type of known microsieves is that of the track-etched membranes. In the case of these, a polymer film is bombarded with heavy ions and the trace left behind in the film by the heavy ions is subsequently broadened by an etching operation to give a pore. As a result of the production process therefor, these membranes have a spatially irregular pore distribution. According to the pore size, the maximum number of pores per unit area is limited to a considerable degree. For example, it is only possible with track-etched membranes in the case of a pore diameter of 8 micrometers to achieve a pore fraction of the total area of the membrane of 5% at most. Moreover, a multitude of pores pass through the base material of the membrane not at right angles but obliquely. Furthermore, double pores occur, which give rise to a common pore having a diameter greater than the nominal diameter.

WO 2011/139445 A1 discloses a method for producing microsieves, in which a photostructurable dry resist film, for example epoxy resin film, is structured by a photolithographic operation to give a microsieve. This is followed by detachment for dissolution of the microsieve from the carrier used in the production, for example by etching. A disadvantage of the known method is that it imposes lower limits on the thickness of the microsieve, since it is very difficult to process epoxide films thinner than about 10 μm.

The problem addressed is that of specifying an improved process for producing a microsieve, with which the disadvantage mentioned at the outset is avoided. More particularly, the production of microsieves thinner than 10 μm is to be enabled.

SUMMARY

The process for producing a microsieve essentially of a photoresist material includes:

applying a photoresist layer to a carrier;
partly covering the photoresist layer with a mask which determines the structure of the microsieve;
exposing the photoresist by the action of radiation;
developing the photoresist;
detaching the microsieve from the carrier.

In the application of the photoresist layer, a liquid photoresist is used.

The process thus creates a microsieve or a multitude of microsieves essentially of the material of the liquid photoresist which later solidifies. In other words, the photoresist thus does not just serve for structuring of an underlying material as in the known use of photolithography, but is also the material for the actual microsieve. The advantage of the use of liquid photoresists for production of microsieves is the material variety thereof, by which it is possible to obtain good adaptability to various uses of the microsieve. In the form of the liquid photoresists, more chemically stable materials are available as compared, for example, with dry resists.

A further advantage is that the thickness of the microsieve, i.e. the thickness of the photoresist layer, by virtue of the deposition operation used in the application of the photoresist layer, for example spin-coating or spraying, can be adjusted virtually as desired. In particular, the microsieves can be produced in thin form, especially with a thickness of less than 10 μm. The photolithography operations used are advantageously widespread and allow a high substrate throughput and hence inexpensive manufacture.

The carrier used may, for example, be a silicon or glass substrate. The mask is especially configured in such a way that the microsieve receives a hole structure, in which case the holes have a diameter, especially homogeneous diameter, between about 1 micrometer and 50 micrometers. In an exemplary configuration, the holes have a homogeneous diameter between 5 micrometers and about 25 micrometers, especially between about 7 micrometers and about 15 micrometers.

Advantageously, prior to application of the photoresist layer to the carrier, a detachment layer activatable thermally or by radiation is applied to the carrier for the detachment of the microsieve from the carrier. With the aid of this detachment layer, the microsieve(s) can be detached from the carrier without destruction.

Alternatively, in an advantageous configuration of the process, the detachment layer activatable thermally or by radiation is used directly as carrier. In other words, no further carrier such as a silicon substrate is used any longer; instead, the entire processing operation takes place exclusively on the detachment layer. In this way, in the production of the microsieves, there is advantageously a saving of material which is not used for the microsieves per se in any case.

A particular advantage in the case of use of the detachment layer as carrier is that the production of the microsieves can thus take place in a roll-to-roll process.

In a further alternative configuration, application of the photoresist layer to the carrier is preceded by application to the carrier of a sacrificial layer for detachment of the microsieve from the carrier. This sacrificial layer is removed, for example by wet-chemical means, after the structuring of the microsieve, which eliminates the connection between the microsieve and the carrier.

In a further alternative for detachment of the microsieve from the carrier, etching is conducted for at least partial dissolution of the carrier.

The microsieve thus obtained may especially be used for separation of solid substances and/or for retention of solid substances from a liquid and/or gas stream. A microsieve may thus generally also be understood to mean a micro filter element. The microsieve may especially be a (separating) membrane.

The microsieve may especially be used for enrichment or extraction of particular cells from cell-containing body fluids, for example from blood, urine, biopsy fluids, saliva, etc., including from human blood or from natural or synthetically created cell suspensions or dilutions thereof.

BRIEF DESCRIPTION OF THE DRAWINGS

These and other aspects and advantages will become more apparent and more readily appreciated from the following description of the exemplary embodiments, taken in conjunction with the accompanying drawings of which:

FIG. 1 illustrates production of a microsieve using a liquid photoresist and an activatable detachment layer on a carrier in a series of cross sections, FIG. 2 illustrates production of a microsieve using a liquid photoresist and a thermally activatable detachment layer which constitutes the carrier in a series of cross sections, FIG. 3 illustrates production of a microsieve using a liquid photoresist and a chemically dissoluble sacrificial layer in a series of cross sections.

DETAILED DESCRIPTION OF THE PREFERRED EMBODIMENT

Figure 4:
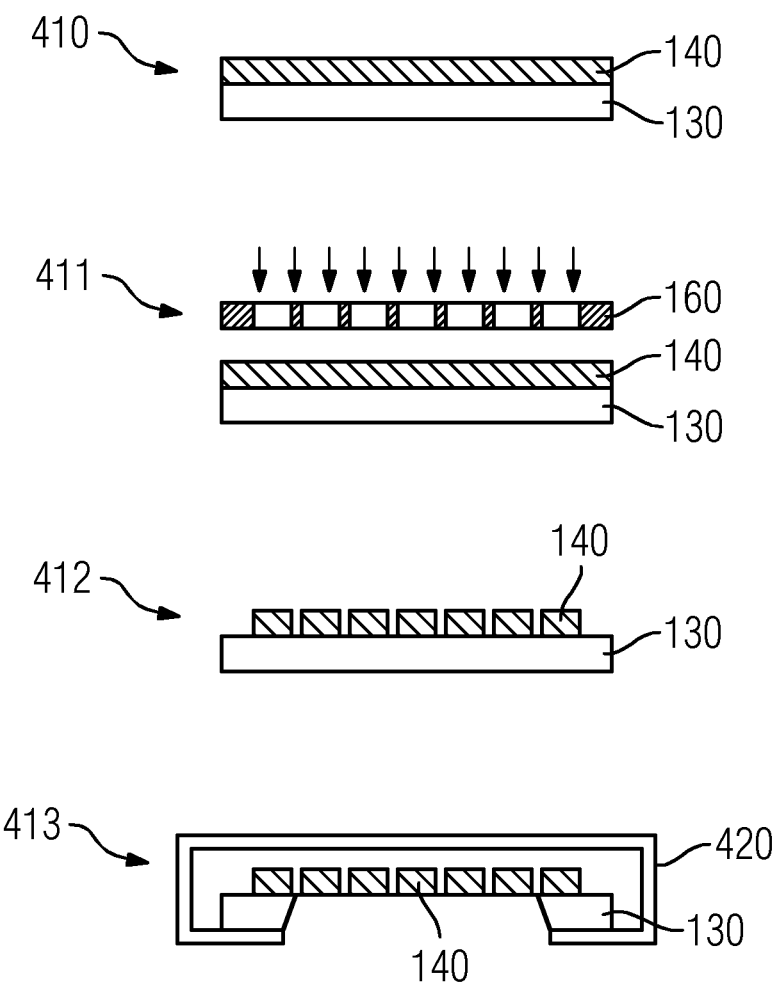
FIG. 4 illustrates production of a microsieve using a liquid photoresist and a wet-chemical re-etching of the carrier in a series of cross sections.

Reference will now be made in detail to the preferred embodiments, examples of which are illustrated in the accompanying drawings, wherein like reference numerals refer to like elements throughout.

FIG. 1 shows a first illustrative production process for production of a microsieve 120 having a defined pore distribution and defined pore geometries from photolithography.

In 110, a carrier 130 for the microsieve 120 to be produced or the composition composed of a multitude of microsieves 120 which is to be produced is provided. The carrier 130 is, for example, a silicon wafer or a glass plate. It is also possible to use other essentially smooth and particularly wafer-like carriers 130. The only prerequisite is that the carrier 130 is suitable for typical photolithography.

In 111, a thermally or electromagnetically activatable detachment layer 150 is applied to the whole area of the carrier 130.

In 112, a photoresist layer 140 is applied to the detachment layer 150. The photoresist layer 140 may be applied in known production variants, for example by spin-coating or spray application. The photoresist layer 140 is produced from a liquid photoresist. The thickness chosen for the photoresist layer 140 is, for example, a thickness of 5 μm. This is a thickness value which is difficult to achieve by dry resists, for example, but is simultaneously advantageous for the use as microsieve.

As is well known, the further processing of the photoresist layer 140 may be preceded by baking, for example at 110° C.

In 113, exposure of the photoresist takes place. For this purpose, the photoresist layer 140 is exposed to suitable radiation. The radiation is masked at particular sites by a mask 160. The configuration of the mask 160 defines the structure of the microsieve to be manufactured, i.e. defines the edges and pores thereof. The crosslinking of the photoresist that sets in during exposure 113 leads to formation of the actual microsieve structure.

In 114, in a manner known per se, development of the photoresist takes place, for example with TMAH solution. Depending on whether a positive or negative resist is used, the parts of the photoresist layer 140 which have been exposed or not exposed beforehand become detached.

This leaves the actual microsieve 120 or, if appropriate, a multitude of separate microsieves 120.

In 115, a thermal activation or irradiation takes place, for example with UV light. This activates the detachment layer 150, and the microsieves 120 become detached from the carrier 130 and the detachment layer 150.

The microsieve 120 thus obtained can subsequently be subjected to a further thermal treatment, for example for stabilization. In addition, the microsieve structure can be separated into smaller substructures.

FIG. 2 shows a second illustrative production process for production of a microsieve 120.

In this case, in 210, in contrast to the first working example, no carrier 130 is provided for the microsieve 120 to be produced or the composition composed of a multitude of microsieves 120 which is to be produced; instead, a photoresist layer 140 is applied directly to a detachment layer 150. The photoresist layer 140 may be applied in known production variants, for example by spin-coating or spray application. The photoresist layer 140 is produced from a liquid photoresist. The thickness chosen for the photoresist layer 140 is, for example, a thickness of 2 μm. The production process according to the second working example can also advantageously be implemented in a roll-to-roll process.

Here too, the further processing of the photoresist layer 140 may be preceded by baking, for example at 110° C.

In 211, exposure of the photoresist takes place. For this purpose, the photoresist layer 140 is exposed to suitable radiation. As in the first working example, the radiation is masked at particular sites by the mask 160.

In 212, development of the photoresist takes place, for example with TMAH solution. Depending on whether a positive or negative resist is used, the parts of the photoresist layer 140 which have been exposed or not exposed beforehand become detached. This leaves the actual microsieve 120 or, if appropriate, a multitude of separate microsieves 120.

In 213, a thermal activation or irradiation takes place, for example with UV light. This activates the detachment layer 150, and the microsieves 120 become detached from the detachment layer 150.

FIG. 3 shows a third illustrative production process for production of a microsieve 120.

In 310, a carrier 130 is provided for the microsieve 120 to be produced. The carrier has been provided with a sacrificial layer 320 which can be removed in a process, for example, of wet-chemical etching. A photoresist layer 140 has been applied in turn to the sacrificial layer 320. The photoresist layer 140 has again been applied in known production variants, for example by spin-coating or spray application. The photoresist layer 140 is again produced from a liquid photoresist. The thickness chosen for the photoresist layer 140 is, for example, a thickness of 10 μm.

In 311, as in the working examples described above, exposure of the photoresist takes place. For this purpose, the photoresist layer 140 is exposed to suitable radiation. As in the first working example, the radiation is masked at particular sites by the mask 160.

In 312, development of the photoresist takes place, for example with TMAH solution. Depending on whether a positive or negative resist is used, the parts of the photoresist layer 140 which have been exposed or not exposed beforehand become detached. This leaves the actual microsieve 120.

In 313, the sacrificial layer 320 is removed, for example by wet-chemical means, and the microsieves 120 thus become detached from the carrier.

FIG. 4 shows a fourth illustrative production process for production of a microsieve 120.

In 410, a carrier 130 is provided for the microsieve 120 to be produced. A photoresist layer 140 has been applied to the carrier 130. The photoresist layer 140 has again been applied in known production variants, for example by spin-coating or spray application. The photoresist layer 140, as in the previous working examples, is produced from a liquid photoresist.

In 411, as in the working examples described above, exposure of the photoresist takes place. For this purpose, the photoresist layer 140 is exposed to suitable radiation. As in the first working example, the radiation is masked at particular sites by the mask 160.

In the fourth working example, a mask 460 which produces a single continuous microsieve 120 is used.

In 412, development of the photoresist takes place, for example with TMAH solution. Depending on whether a positive or negative resist is used, the parts of the photoresist layer 140 which have been exposed or not exposed beforehand become detached. This leaves the actual microsieve 120.

In 413, in contrast to the previous working examples, a wet-chemical re-etching operation of the carrier now takes place. This can be done using a protective can 420 for the microsieve structure. What remains is essentially the microsieve 120 and, according to the execution of the re-etching operation, a portion of the carrier 130 which may, for example, form an edge for the microsieve 120, as indicated in FIG. 4.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV,* 358 F3d 870, 69 USPQ2d 1865 (Fed. Cir. 2004).

The invention claimed is:

1. A process for producing a microsieve substantially formed by a photoresist material, comprising:
    applying a liquid photoresist to a first surface of a carrier to form a photoresist layer, the carrier being a detachment layer activatable by radiation and having a second surface opposite to the first surface;
    partly covering the photoresist layer with a mask determining a structure of the microsieve;
    exposing the photoresist by action of radiation;
    developing the photoresist; and
    activating the carrier by irradiating the second surface of the carrier, to detach the photoresist from the carrier.

2. A process for producing a microsieve substantially formed by a photoresist material, comprising:
    applying a liquid photoresist to a carrier to form a photoresist layer;
    partly covering the photoresist layer with a mask determining a structure of the microsieve;
    exposing the photoresist by action of radiation;
    developing the photoresist;
    applying a protective can to the carrier, the protective can covering an edge portion of the carrier while exposing a central portion of the carrier; and
    with the protective can applied to the carrier, detaching the central portion of the carrier from the photoresist by etching to obtain dissolution of the central portion, the edge portion of the carrier remaining on the photoresist as an edge of the microsieve upon completion of the etching.

* * * * *